(12) United States Patent
Smith et al.

(10) Patent No.: US 6,486,547 B2
(45) Date of Patent: Nov. 26, 2002

(54) MICROELECTRONIC ASSEMBLY INCORPORATING LEAD REGIONS DEFINED BY GAPS IN A POLYMERIC SHEET

(75) Inventors: John W. Smith, Palo Alto, CA (US); Joseph Fjelstad, Sunnyvale, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/798,809

(22) Filed: Mar. 2, 2001

(65) Prior Publication Data

US 2001/0010400 A1 Aug. 2, 2001

Related U.S. Application Data

(60) Division of application No. 09/140,589, filed on Aug. 26, 1998, now Pat. No. 6,228,686, which is a continuation-in-part of application No. 08/715,571, filed on Sep. 18, 1996, now Pat. No. 6,329,607

(60) Provisional application No. 60/057,741, filed on Aug. 28, 1997, provisional application No. 60/056,965, filed on Aug. 26, 1997, and provisional application No. 60/003,927, filed on Sep. 18, 1995.

(51) Int. Cl.⁷ ............................................... H01L 23/48
(52) U.S. Cl. .................... 257/688; 257/690; 257/700; 257/734; 257/748; 257/759; 257/774; 174/261
(58) Field of Search ................... 257/642, 643, 257/700, 748, 759, 773, 774, 690, 688, 734, 758; 174/260, 261, 253, 254, 52.4; 228/180.21

(56) References Cited

U.S. PATENT DOCUMENTS

| 3,825,353 A | 7/1974 | Loro | 317/234 |
|---|---|---|---|
| 4,893,172 A | 1/1990 | Matsumoto et al. | 257/738 |
| 5,086,337 A | 2/1992 | Noro et al. | 257/726 |
| 5,148,265 A | 9/1992 | Khandros et al. | 257/773 |
| 5,148,266 A | 9/1992 | Khandros et al. | 257/773 |
| 5,398,863 A * | 3/1995 | Grube et al. | 228/106 |
| 5,420,461 A | 5/1995 | Mallik et al. | 257/734 |
| 5,518,964 A | 5/1996 | DiStefano et al. | 437/209 |
| 5,602,442 A | 2/1997 | Schueller et al. | 257/738 |
| 5,688,716 A | 11/1997 | DiStefano et al. | 438/618 |
| 5,706,174 A | 1/1998 | DiStefano et al. | 361/749 |
| 5,723,894 A | 3/1998 | Ueno et al. | 257/692 |
| 5,763,941 A | 6/1998 | Fjelstad | 257/669 |
| 5,798,286 A | 8/1998 | Faraci et al. | 438/113 |
| 5,859,472 A | 1/1999 | DiStefano et al. | 257/674 |
| 5,904,498 A | 5/1999 | Fjelstad | 438/106 |
| 5,973,394 A | 10/1999 | Slocum et al. | 257/669 |
| 5,976,913 A | 11/1999 | DiStefano | 438/113 |
| 5,989,936 A | 11/1999 | Smith et al. | 438/106 |
| 5,998,291 A | 12/1999 | Bakhit et al. | 438/618 |
| 6,191,368 B1 | 2/2001 | DiStefano et al. | 174/260 |
| 6,228,686 B1 * | 5/2001 | Smith et al. | 438/117 |
| 6,239,607 B1 * | 12/2001 | Fjelstad et al. | 174/261 |

FOREIGN PATENT DOCUMENTS

WO   WO 97/11588   3/1997

* cited by examiner

Primary Examiner—David L. Talbott
Assistant Examiner—Alonzo Chambliss
(74) Attorney, Agent, or Firm—Lerner, David, Littenberg, Krumholz & Mentlik, LLP

(57) ABSTRACT

A sheet such as a polymeric dielectric has elongated lead regions partially separated from the main region of the sheet by gaps in the sheet, and has conductors extending along the lead regions. The lead regions are connected to contacts on a microelectronic element, and the microelectronic element is moved away from the main region of the sheet, thereby bending the lead regions downwardly to form leads projecting from the main region of the sheet.

21 Claims, 8 Drawing Sheets

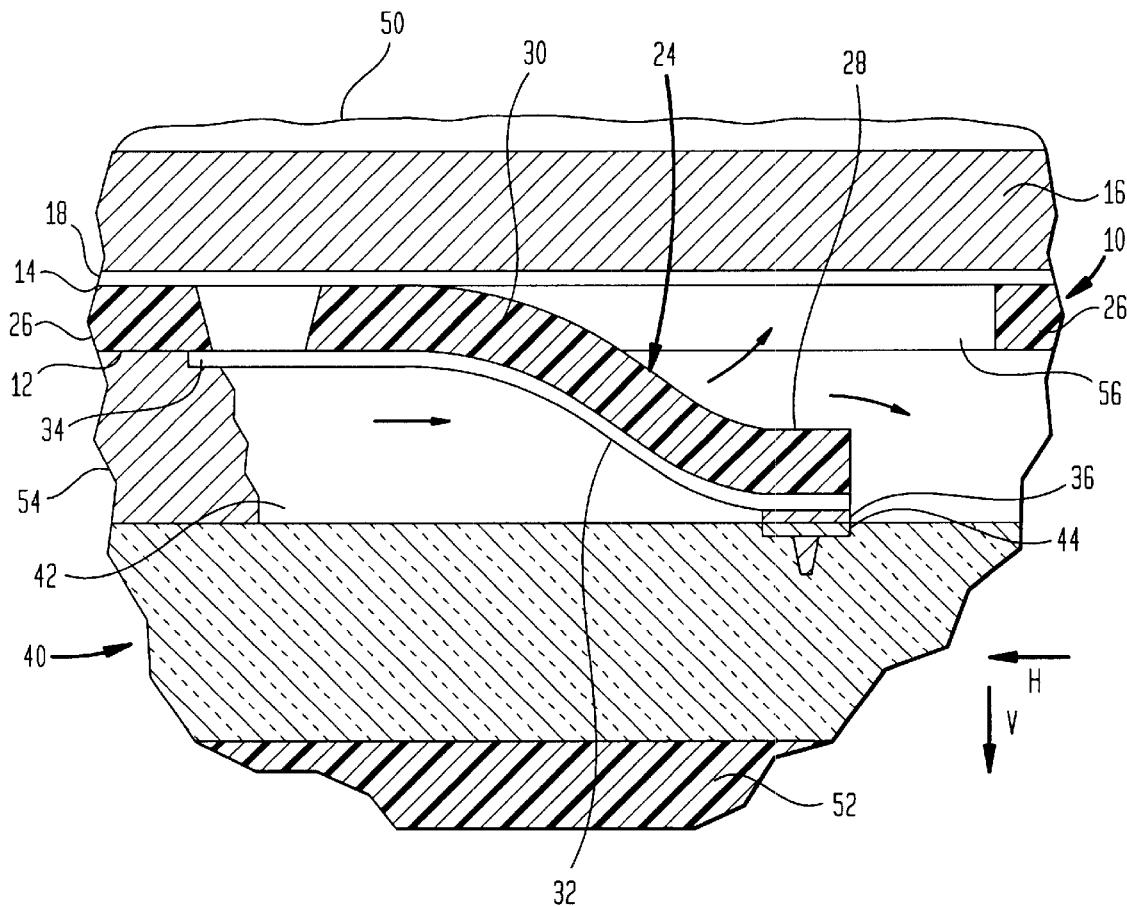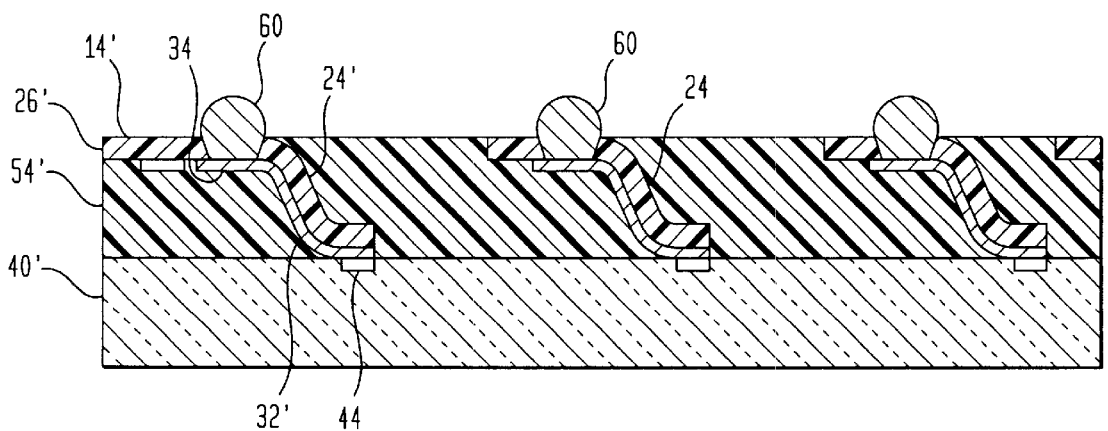

MICROELECTRONIC ASSEMBLY INCORPORATING LEAD REGIONS DEFINED BY GAPS IN A POLYMERIC SHEET

CROSS REFERENCE TO RELATED APPLICATIONS

This is a divisional application of U.S. patent application Ser. No. 09/140,589 filed Aug. 26, 1998, U.S. Pat. No. 6,228,686, which is a continuation-in-part of U.S. patent application Ser. No. 08/715,571 filed Sep. 18, 1996, now U.S. Pat. No. 6,329,607 which in turn claims benefit of U.S. Provisional Patent Application No. 60/003,927 filed Sep. 18, 1995. The present application further claims benefit of U.S. Provisional Applications No. 60/057,741 filed Aug. 28, 1997 and 60/056,965 filed Aug. 26, 1997.

BACKGROUND OF THE INVENTION

The present invention relates to methods of making microelectronic assemblies, and to components for use in fabrication of microelectronic assemblies.

Complex microelectronic devices such as modern semiconductor chips require numerous connections to other electronic components. For example, a complex microprocessor chip may require hundreds of connections to external devices.

As described in certain preferred embodiments of commonly assigned U.S. Pat. Nos. 5,148,265 and 5,148,266, a chip package may include a flexible sheetlike structure referred to as an "interposer" or "chip carrier" having terminals disposed on a flexible sheetlike structure. The interposer may be disposed on the front or contact bearing surface of the chip so that the terminals face away from the chip. The terminals are connected to contacts on the chip by flexible leads. Preferably, a compliant layer is disposed between the terminals and the chip. In certain preferred embodiments, the packaged chip occupies the same area, or only a slightly larger area than the chip itself. The packaged chip can be readily tested and can be mounted to a substrate such as a printed circuit board by bonding the terminals of the chip carrier to the contact pads of the substrate. In use, the terminals on the chip carrier are free to move relative to the chip. This allows the assembly to compensate for differential thermal expansion and warpage of the chip or substrate without imposing significant stresses on the bonds.

As taught in certain embodiments of commonly assigned U.S. Pat. No. 5,518,964, microelectronic assemblies incorporating flexible leads can be fabricated using a first element or connection component including a dielectric structure having leads on a bottom surface. Each such lead has a fixed end permanently attached to the dielectric structure and, typically, connected to one or more terminals on the top surface of the dielectric structure. Each such lead also has a free or tip end remote from the fixed or terminal end. Preferably, the free or tip ends of the leads are releasably attached to the dielectric structure. This element can be juxtaposed with a second microelectronic element such as a semiconductor chip or wafer, and the free ends of the leads may be bonded to contacts on such second microelectronic element. After bonding, the elements are moved vertically away from one another through a predetermined displacement, thereby detaching the free or tip ends of the leads from the bottom surface of the dielectric component and deforming the leads to a vertically extensive configuration. Preferably, a curable encapsulant is introduced between the elements and around the leads during or after the moving step, so as to provide a compliant layer between the dielectric layer and the second microelectronic element. This arrangement allows fabrication of compliant chip assemblies having advantages similar to those discussed above with respect to the '265 and '266 patents using a process which permits simultaneous connection and forming of numerous leads. In certain preferred embodiments according to the '964 patent, one of the microelectronic assemblies may include numerous semiconductor chips. For example, one microelectronic element may be a wafer incorporating numerous chips, and leads on all of the chips may be connected and formed in the same operations. After these operations, the resulting large assembly can be severed to form individual units each including one or more of the chips originally present in the wafer, together with a portion of the dielectric element and the terminals thereon.

In those embodiments of the '964 invention which use a pre-formed connection component with leads thereon, and which register the connection component with a wafer or other microelectronic device, the spacing between the leads on the component desirably is controlled precisely. This allows registration of the free ends of the leads with contacts on a wafer or other microelectronic device. For example, certain preferred embodiments disclosed in the '964 patent use a temporary reinforcing layer overlying the dielectric layer, and also use a rigid, ring-like frame to maintain the dielectric layer and the reinforcing layer to maintain the dielectric layer in tension. These features help to control thermal expansion and contraction of the connection component during the processes used to bond the free ends of the leads to the wafer or other microelectronic component, and help to maintain the desired spacing between the lead free ends.

Commonly assigned U.S. Pat. No. 5,989,936 discloses enhancements to processes taught in the '964 patent. Certain processes taught in the '936 patent use a metallic conductive element. Leads are provided on a bottom surface of such element. Each lead has a fixed end permanently attached to the conductive element, and a free or tip end releasably attached to the conductive element. The conductive element with the leads thereon is juxtaposed with a microelectronic element such as a chip or wafer, and the tip ends of the leads are bonded to the contacts of the microelectronic element. The conductive element and microelectronic element are moved away from one another, thereby bending the leads into a vertically-extensive configuration, and a flowable material is injected and cured so as to form a dielectric layer around the leads. After formation of the dielectric layer, the conductive layer is etched or otherwise removed so as to leave portions of the conductive layer as individual terminals associated with the individual leads. In a variant of this process, each lead may have a pre-formed terminal of a first metal such as gold, provided at the juncture of the fixed end of the lead and the conductive layer before the lead-bonding and moving steps. The conductive layer is formed from a second metal, such as copper. When the conductive layer is etched away, the pre-formed terminals remain.

Preferred arrangements taught in commonly assigned U.S. Pat. Nos. 5,859,472 and 6,191,368 disclose curved lead configurations useful in the foregoing processes. Commonly assigned U.S. Pat. No. 5,976,913 discloses further improvements in such processes. In the preferred arrangements taught in this application, restraining straps which are shorter and stronger than the leads constrain the motion of the elements as they move away from one another to deform the leads. The preferred aspects of commonly assigned U.S. Pat. No. 5,798,286 disclose further improvements in the basic process taught in the '964 patent, with respect to the processing of arrays of individual semiconductor chips bonded to leads on a single dielectric element so that the leads associated with all of the separate chips can be deformed and in a single operation.

The disclosures of all of the aforementioned patents and applications are incorporated herein by reference.

Despite these advances in the art of making microelectronic assemblies, still further improvements would be desirable.

SUMMARY OF THE INVENTION

One aspect of the present invention provides methods of making microelectronic assemblies. A method in accordance with this aspect of the invention includes the step of providing a sheet including a main portion and a plurality of gaps extending through the sheet. These gaps partially surround and define a set of elongated lead regions in the sheet. Each lead region has a fixed end connected to the main portion of the sheet and a tip end remote from the fixed end. The lead regions of the sheet include conductors extending between the tip ends and the fixed ends. In a further step of the method, the sheet is juxtaposed with a microelectronic component so that the tip ends of the lead regions on the sheet are aligned with contacts on the microelectronic element. The tip ends of the lead regions are connected to contacts on the microelectronic element. After the tips ends of the lead regions have been attached to the contacts, the main portion of the sheet and the microelectronic element are moved away from one another through a predetermined displacement in a vertical direction as to bend the lead regions downwardly from the main portion and thereby form leads projecting from the main portion of the sheet downwardly to the microelectronic element.

Desirably, the step of providing the sheet includes the step of bonding the sheet to a reinforcing structure prior to the step of connecting the tip ends of the leads to the contacts. The sheet may be bonded to the reinforcing structure or support structure before the gaps in the sheet are formed. In a particularly preferred arrangement, the sheet includes a polymeric dielectric layer such as a polyimide layer and the step of providing the sheet includes the step of providing conductive metallic strips on a surface of the polymeric layer. For example, some or all of the strips may be formed on a bottom surface of the polymeric layer facing away from the reinforcing structure. The step of forming the gaps in the sheet may include the step of etching or plating the dielectric as, for example, by plasma etching or laser ablating the dielectric layer. The metallic strips may protect regions of the dielectric layer underlying the strips during the gap-forming process. Typically, the sheet is provided with terminals facing upwardly, toward the reinforcing structure, the terminals being connected to the conductors of the lead regions. The reinforcing structure is removed near the end of the process, leaving the resulting assembly with exposed terminals connected by the flexible leads to the contacts on the microelectronic element.

As further discussed below, the sheet can be fabricated in a few simple, inexpensive steps. Moreover, the formed leads can incorporate polymeric portions derived from the sheet. The polymeric layers in the leads physically reinforce the metallic conductors, and permit the use of thin metallic conductors. These features enhance the fatigue resistance of the leads.

As the lead regions of the sheet are bent downwardly, out of the plane of the main portion of the sheet, openings are left in the spaces formerly occupied. Preferably, the process also includes the step of injecting a flowable material between the main portion of the sheet and the microelectronic element, so that the flowable material encapsulates the projecting leads, and then curing this flowable material to form a dielectric layer, preferably a compliant layer such as a gel or elastomer. The reinforcing structure blocks the flow of the flowable material through the openings in the main portion of the sheet. This prevents the encapsulant from covering over the terminals.

Desirably, the step of removing the reinforcing structure is performed after the tip ends of the leads are attached to the contacts on the microelectronic element and, most preferably after the flowable dielectric material is introduced between the main portion of the sheet and the dielectric element. The reinforcing structure stabilizes the dimensions of the sheet and allows accurate alignment of the tip ends of the leads with the contacts on the microelectronic element. Most preferably, the reinforcing structure is formed from a material having uniform, predictable thermal expansion and contraction properties, such as a metal, a glass or certain nonpolymeric material. In a particularly preferred arrangement, the coefficient of thermal expansion of the reinforcing structure is approximately equal to that of the microelectronic element. For example, where the microelectronic element is a wafer or other structure formed principally from silicon, the reinforcing structure desirably has a coefficient thermal expansion between about 2 and about $6 \times 10^{-6}/°$ C. This adds in maintaining registration between the tips of the lead regions and the contacts on the microelectronic element over the main temperatures encountered during the assembly process.

Preferably, the top surface of the sheet, facing toward the reinforcing element adheres to the reinforcing element. Depending upon the fabrication methods utilized, this adhesion may result from a direct bond between the top surface of the sheet and the reinforcing element or from an intervening adhesive layer. During the moving step, as the lead regions are bent downwardly, each lead region may be peeled away from the reinforcing layer. The reinforcing structure may be removed by etching, or else may be peeled away from the main portion of the sheet, typically after the moving step. Alternatively, the bond between the main portion of the sheet and the reinforcing layer may be broken by degrading the adhesive through the application of heat or radiant energy. In a further variant, the bond between the lead regions and the reinforcing structure may be broken selectively in the lead regions, as by selective application of heat or, preferably, by selective application of radiant energy to the lead regions. The reinforcing structure may be transparent to radiation within a predetermined wavelength band as, for example, ultraviolet radiation. As discussed below, such radiation can be used to release adhesive bonds between the reinforcing structure and the sheet.

The conductors on the lead regions desirably include metallic strips extending along one or both surfaces of the sheet in the lead regions. In one arrangement, the metallic strips extend along bottom surfaces of the lead regions and extend to terminals disposed in the main region of the sheet on the bottom surface of the sheet, i.e., the surface of the sheet facing away from reinforcing structure. The sheet desirably has openings or "vias" extending through it at the terminals, so that the terminals are exposed to the top surface of the sheet. Electrically-conductive bonding materials such as eutectic bonding alloys, solder, diffusion bonding alloys and electrically-conductive polymeric compositions may be disposed on the tip ends of the leads in contact with the metallic strips. In this arrangement, only one metallic layer need be formed on the sheet. In a variant of this approach, the main region of the sheet may be provided with an electrically-conductive potential reference plane formed from the same metallic layer used to form the metallic strips on the bottom surfaces of the lead regions. In other embodiments, conductive elements such as metallic strips are provided on both surfaces of lead regions. For example, an electrically-conductive potential reference plane may be formed in the main region of the sheet on the top surface of the sheet, and the lead regions may be provided with reference conductors on the top surface continuous with the potential plane layer. Signal conductors may be provided on the bottom surfaces of the lead regions. In other arrangements, the bottom surfaces of the lead regions may be provided with reference conductors, whereas the signal conductors may be provided on the top surfaces of the lead regions. In still other arrangements, paired signal conductors may be provided on the top and bottom surfaces of the lead regions and both conductors of each such pair may be conducted to contacts of microelectronic elements.

Yet another aspect of the invention provides components for forming microelectronic assemblies. Components in accordance with this aspect of the invention desirably include a sheet having a main portion and a plurality of gaps partially surrounding and defining a set of flexible, elongated lead regions within the sheet. Each such lead region has a fixed end connected to the main portion of the sheet and a tip end remote from the fixed end. As discussed above in connection with the methods, the lead regions of the sheet include conductors extending between the tip ends and the fixed ends of the lead regions. Desirably, the sheet includes a continuous layer of a polymeric material having oppositely facing top and bottom surfaces extending within the main portion of the sheet and within the lead regions. The sheet typically includes metallic strips extending on the polymeric layer in the lead regions. Some or all of these strips desirably extend from the lead regions onto the main region of the sheet. At least some of the metallic strips are electrically isolated from others of the metallic strips, so that the strips may serve as signal conductors in the finished assemblies. As discussed above in connection with the methods, the metallic strips may be provided on the top surface; on the bottom surface; or on both surfaces of the sheet in the lead regions. Desirably, the component further includes terminals attached to the sheet in the main region and exposed to the top surface of the sheet, the terminals being electrically connected to the strips. For example, where the terminals are physically disposed on the bottom surface of the strip, vias may be provided through the sheet in registration with the terminals. The vias may have metallic, conductive liners extending to the top surface. Alternatively, the vias may be left unfilled. The gaps defining straight lead regions may be substantially U-shaped, with the bases of the U-shapes at the top ends of the leads. Alternatively, the lead regions may be curved, and the gaps bounding each lead region may be correspondingly curved. The sheet may be provided with features which reinforce it against teasing at the ends of the gaps where the lead regions join the main region of the sheet. For example, the sheet may have holes slightly larger in diameter than the width of a gap disposed at the ends of the gap.

The component may also include a reinforcing element, such as a reinforcing element having controlled, predictable thermal expansion characteristics as discussed above. Desirably, the top surface of the sheet is releasably bonded to the bottom surface of the reinforcing element.

Still further aspects of the present invention include methods of making components such as the components discussed above. Methods according to this aspect of the invention desirably include the step of providing a polymeric layer and forming metallic strips on the polymeric layer. The method desirably further includes the step of forming gaps in the polymeric layer by selectively removing portions of such layer so as to form gaps extending partially around lead regions of the polymeric layer and so as to leave a main region of the polymeric layer, physically connected to the lead regions. The steps of forming the metallic strips and forming the gaps are performed so as to leave one or more strips extending onto each lead region from the main region. Desirably, the metallic strips are formed prior to the gap-forming step, and the strips protect the polymeric layer during the gap-forming step. The method of making a component may further include the step of providing a reinforcing element bonded to the top surface of the polymeric layer. Desirably, the step of providing the reinforcing element is performed prior to the gap-forming step, so that the reinforcing element holds the various portions of the layer during and after the gap-forming step.

Still further aspects of the invention include finished assemblies. As discussed below, the finished assemblies may include sheetlike elements with polymeric layers and with an array of terminals thereon, the terminals being connected to a chip or other microelectronic element by leads including polymeric layers integral with the polymeric layer of the sheetlike element and metallic conductive strips.

These and other objects, features and advantages of the present invention would be more readily apparent from the detailed description of the preferred embodiments set forth below, taken in conjunction with the accompanying drawings.

BRIEF DESCRIPTION OF THE DRAWINGS

FIG. 5 is a fragmentary sectional view similar to FIG. 1 but depicting the components shown in FIGS. 1–4 during a stage of the process.

FIG. 6 is a diagrammatic sectional view depicting an assembly made by the process of FIGS. 1–5.

DETAILED DESCRIPTION

Figure 1:
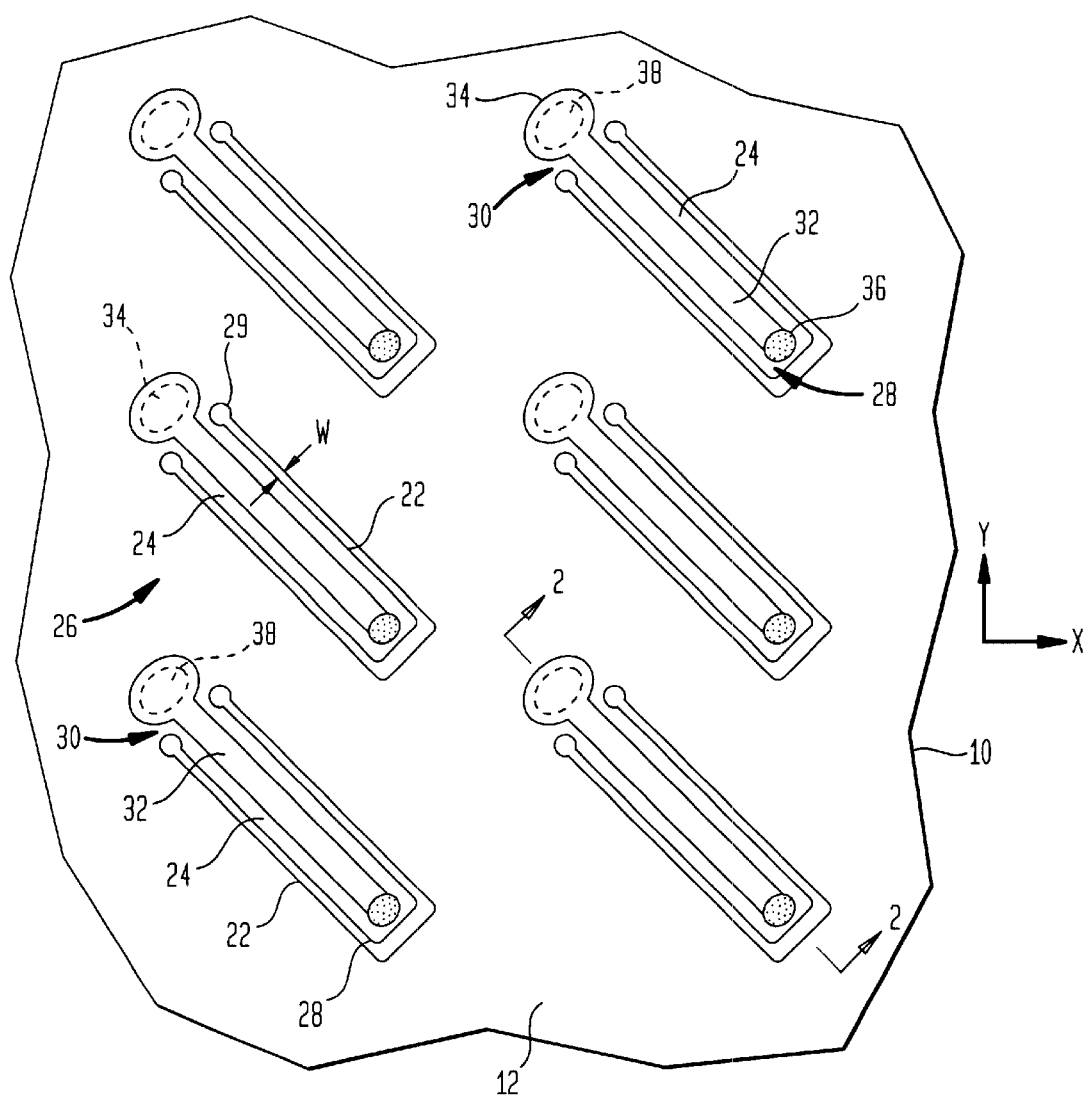
FIG. 1 is a fragmentary, diagrammatic bottom plan view depicting a component in accordance with one embodiment of the invention.
Figure 2:
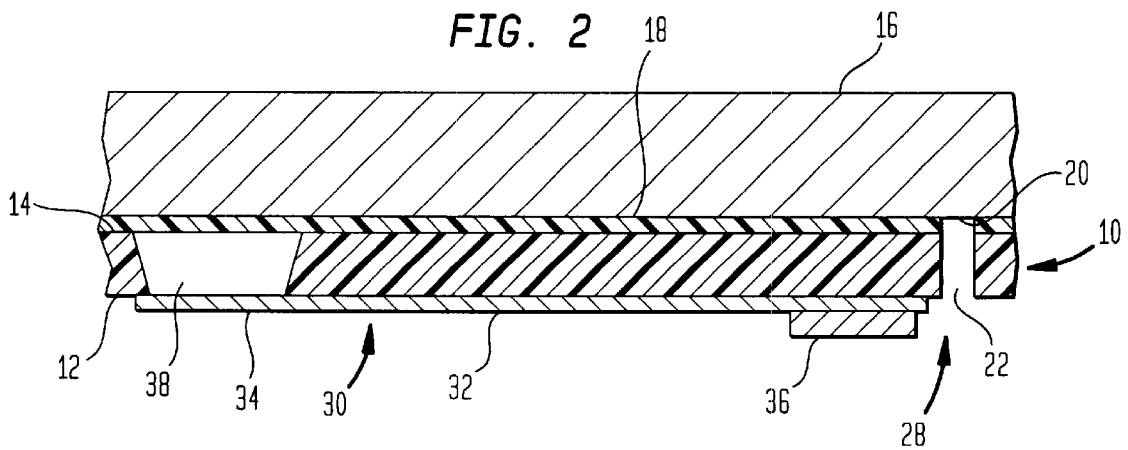
FIG. 2 is a fragmentary sectional view on an enlarged scale taken along line 2—2 in FIG. 1.

A component in accordance with one embodiment of the invention includes a sheet formed from a layer of a flexible dielectric material 10 such as polyimide, desirably between about 10 μm and 100 μm thick, and more desirably between about 25 μm and about 75 μm thick. Sheet 10 has a bottom surface 12 visible in FIG. 1 and a top surface 14 (FIG. 2). A reinforcing element 16 overlies and confronts top surface 14 of sheet 10. The reinforcing element is formed from molybdenum, invar or another material having a coefficient thermal expansion close to that of silicon. Nonmetallic materials such as silicon, glass or quartz also can be employed. The coefficient of expansion of silicon is about $3 \times 10^{-6}/°$ C. and hence the coefficient of thermal expansion of the reinforcing element desirably is close to this value, i.e., between about 2 about $6 \times 10^{-6}/°$ C. Reinforcing element 16 desirably is thicker than dielectric layer 10. For example, the reinforcing element may be about 200 microns thick or thicker.

An adhesive layer 18 forms a peelable adhesive bond between the top surface 14 of the dielectric layer and the facing bottom surface 20 of layer 16. Adhesive layer 18 is shown as a separate layer in FIG. 2 for clarity of illustration. However, the adhesive layer 18 may be formed integrally with the dielectric layer or may be provided as a separate layer having a different composition. Such separate layers may include, for example, acrylics or epoxies. The adhesive layer may includes a heat-activatable release agent such as a blowing agent effective to cause foaming of the adhesive at a preselected temperature higher than the temperature used in the lead tip bonding operation discussed below. Foamable adhesive layers of this type are commercially available from the Nitto Denko Corporation of Japan. The adhesive layer may be applied as a separate tape, such as a double-sided adhesive tape. An integral adhesive layer may be provided by applying the dielectric material of layer 10 as an uncured or partially cured layer as, for example, by coating the bottom surface 20 of the reinforcing element with the material to form the dielectric layer in an uncured or partially cured condition and then curing such material in contact with the bottom surface of the reinforcing element.

Dielectric layer 10 has a series of gaps 22 extending through the entire thickness of the dielectric layer. As best seen in FIG. 1, gaps 22 are generally U-shaped. Each U-shaped gap partially surrounds and defines an elongated lead region 24. Thus, the U-shaped gaps subdivide the sheet 10 into a plurality of lead regions 24 and a main region 26 incorporating those areas of sheet outside of the lead regions. Each lead region has a fixed end 30 at the open end of the U-shaped gap, where the lead region 24 joins the main region 26. Each lead region also has a tip end 28, at the base of the U-shaped gap, remote from fixed end 30. The individual arms of each U-shaped gap 22 desirably are elongated narrow slits. Each slit terminates in a generally cylindrical hole 29 at the end of the arm, i.e., at the open end of the U-shaped gap defining the fixed end 30 of the lead region. Each such hole 29 may have a diameter slightly larger than the width of the individual gap arm.

A metallic conductive strip 32 extends along the bottom surface of dielectric sheet 10 within each lead region 24. Each such metallic strip 32 extends beyond the fixed end 30 of the associated lead region and extends to a metallic terminal 34 disposed on the main region 26 of sheet 10, on the bottom surface of the sheet. The metallic strips 32 are provided with bonding material masses 36 at the tip ends of the lead regions. The bonding material masses 36 may be formed from essentially any material capable of forming an electrically-conductive bond between the metal of the strip and the contacts of a microelectronic element. For example, the electrically-conductive bonding material 36 may include a fusible metal such as a solder; an alloy-forming bonding material such as a eutectic bonding alloy; or a conductive polymeric composition. The precise selection of bonding materials will depend, inter alia, on the composition of the metallic strips and the contacts and the desired bonding process and the like. By way of example, suitable solders include lead-tin solders whereas metals such as tin, silicon and germanium and alloys of the same with gold can be used as eutectic bonding materials for bonding a gold metallic strip to a gold-plated contact. Suitable electrically-conductive polymeric composition includes metal-filled and carbon-filled epoxies and thermoplastics.

Polymeric sheet 10 has holes or vias 38 extending through the sheet in registration with terminals 34, so that each terminal 34 is exposed through the associated via to the top surface 14 of the polymeric sheet.

As shown in FIG. 1, the terminals 34 and lead regions 24 are disposed in a regular, grid-like array extending in horizontal directions along sheet 10. The actual layout of the lead regions and the placement of the tip ends 28 of the lead regions will be selected to match the placement of contacts on the microelectronic element with which the component will be used in an assembly process. However, where the tip ends of the leads are to be disposed in a substantially rectilinear grid extending in first and second horizontal directions x and y, it is desirable to orient the lead regions at an oblique angle, typically about 45°, to these directions as shown in FIG. 1. Relatively long lead regions can be accommodated in this arrangement. It should be appreciated that only a small region of the component is illustrated in FIGS. 1 and 2. The horizontal dimensions of the sheet are as larger or larger than the horizontal dimensions of the components with which the sheet will be assembled during the process. For example, a component to be assembled with a wafer may have horizontal dimensions equal to the diameter of the wafer as, for example, 10 inches or 12 inches or even larger. Such a component typically will include thousands of individual lead regions.

A component as discussed above with reference to FIGS. 1 and 2 may be fabricated by using conventional processing techniques to apply metallic strips 32 on the bottom surface of layer 10 and to form vias 38. For example, the metallic strips may be formed by a conventional subtractive etching process in which a continuous metallic layer is applied on the bottom surface 12 of the polymeric sheet and then etched to form the individual leads. Alternatively, the strips can be formed by an additive plating process in which a thin conductive layer is formed on the bottom surface of layer 10 by sputtering or electroless plating. The layer is then selectively masked with a resist and plated with additional metal to form the leads and terminals. The resist is then removed and the thin layer is removed by a brief etching process. Vias 38 desirably are formed by laser ablating or chemically etching the layer. Such laser ablating or chemical etching may be performed before or after applying the metal which forms terminals 34. Bonding materials 36 is applied to the metallic strips by conventional procedures. For example, where bonding material 36 is applied by plating, such plating step may be performed while the metal on the bottom surface is an electrically-continuous layer, prior to etching the metal to form separate, individual strips on the individual lead portions. All of the foregoing steps may be performed either before or after polymeric sheet 10 is joined to reinforcing element 16. Where the polymeric layer is formed as a separate layer, it can be bonded to the support structure using conventional lamination techniques, with laminating adhesive as discussed above. Alternatively, the polymeric layer may be formed in situ on the surface of the reinforcing element, as by coating the support structure with a curable dielectric material such as a polyimide precursor composition using conventional spin-coating or other techniques and then curing the dielectric material on the surface of the reinforcing element.

When the dielectric layer is in place on the reinforcing element gaps 22 are formed by selectively removing a polymer material from layer 10. In one procedure, the gaps may be formed by laser ablating the polymer construction, using moving optical elements to sweep the laser beam across the surface of the polymeric layer in a predetermined pattern to form the U-shaped gaps 22. A fixed mask such as a molybdenum mask having U-shaped gaps corresponding to the desired gaps to be formed may be placed over the bottom surface and the laser beam may be scanned across the surface in a raster-like pattern. The molybdenum mask will protect the polymeric layer except in the areas where the U-shaped gaps are to be formed. In still further variants, the gaps may be formed by applying a photoresist and selectively curing the photoresist using a pattern-wise illumination process so as to leave gaps in the photoresist where the polymeric layer is to be removed and then exposing the polymeric layer to a liquid, gaseous or plasma etchant capable of eroding the polymer as, for example, a plasma formed from a halogen and oxygen. Because gaps 22 are formed after the polymeric sheet is in place on the support structure 16, and after the polymeric sheet is ready adhering the support structure, the lead regions remain in place when they are formed. The support structure stabilizes the polymeric layer and prevents undesired dimensional changes. Thus, maximum precision in registration of the metallic strips and bonding material masses with one another and with the features of the polymeric layer can be achieved by forming the metallic features while the polymeric layer is in place on the support structure.

Figure 3:
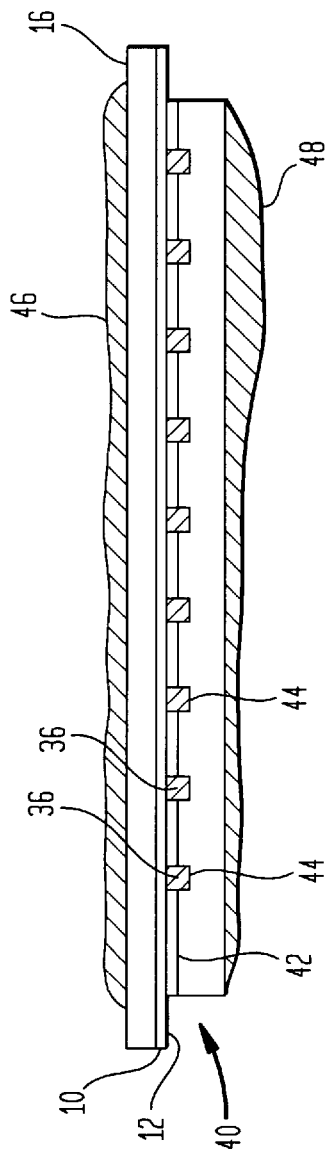
FIG. 3 is a diagrammatic side elevational view depicting the component of FIGS. 1 and 2 in conjunction with other components during one step of the process in accordance with one embodiment of the invention.

The component of FIGS. 1 and 2 can be assembled with a microelectronic element such as a silicon chip or a silicon wafer 40 having a front surface 42 with electrical contacts 44 thereon. As shown in FIG. 3, the component is juxtaposed with the microelectronic element so that the bottom surface 12 of sheet 10 confronts the front surface 42 of the microelectronic element, and so that the tip of each lead, and the mass of bonding material 36 on each such tip, is aligned with one contact 44 of the microelectronic element. The alignment step may be performed by the use of conventional machine vision apparatus which detects fiducial marks (not shown) on the component and on the microelectronic element. As noted above, the tip ends of the leads are maintained in position relative to one another by the reinforcing element. Because of the reinforcing element is well matched in thermal expansion with the microelectronic element 40, changes in dimensions due to temperature changes in this process will affect both the connection component and the wafer equally. Therefore, the tip ends of the lead regions may be maintained in precise registration with the contacts on the microelectronic element. The components are heated and forcibly advanced towards one another to forcibly engage the lead tip ends with the contacts of the microelectronic element. Heat and/or pressure applied by the platens activates the bonding material 36 and forms a secure, electrically conductive bond between the conductive metal strips 32 of the lead regions and the contacts 44 of the microelectronic element. Other devices may be used to force the component against the microelectronic element. For example, a fluid under pressure may be introduced between top platen 46 and the reinforcing element 16, or between the bottom platen 48 and the rear surface of element 40; or both. The heat and pressure applied during this bonding process may partially degrade the adhesive joint 18 (FIG. 2) which holds sheet 10 against reinforcing element 16, and may reduce the peel strength of such adhesive joint. However, the adhesive joint should continue to hold the top surface 14 of the sheet against the reinforcing structure during the bonding operation.

Figure 4:
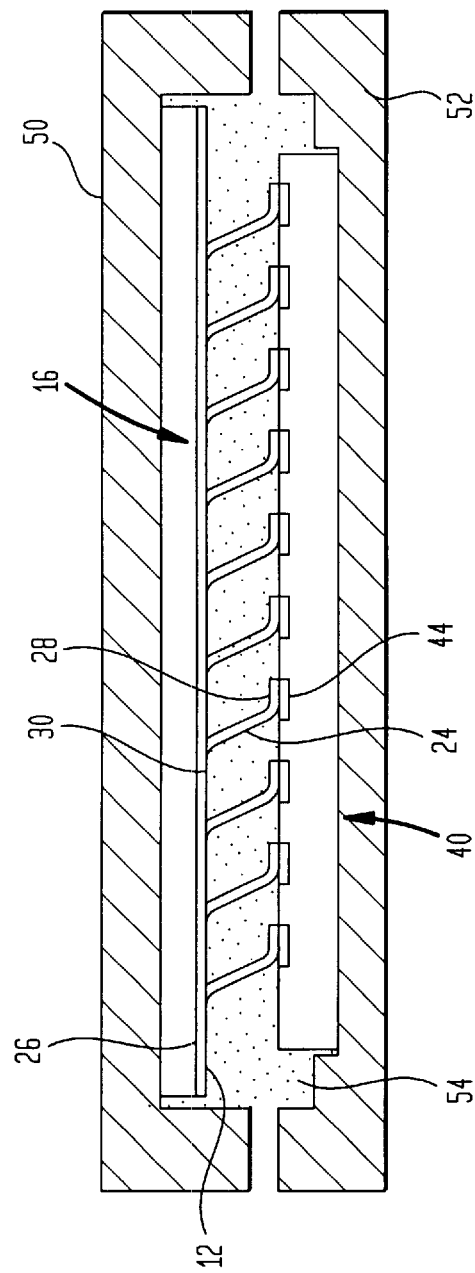
FIG. 4 is a diagrammatic sectional view depicting the components of FIGS. 1–3 during a later step of the process.

In the next stage of the process, the main portion 26 of sheet 10 is moved vertically away from the microelectronic element or wafer 40. Thus, as shown in FIG. 4, the microelectronic element 40 and reinforcing element 16 are engaged with upper and lower fixtures 50 and 52. Thus, the microelectronic element 40 moves downwardly relative to the main portion 26 of sheet 10. Because the tip ends 28 of the lead portions 24 are attached to the microelectronic element, this downward movement of the microelectronic element 40 (in the direction indicated by arrow V in FIG. 5) relative to the main portion 26 of the sheet causes the lead portions 24 to bend downwardly, out of the original plane of sheet 10 and project downwardly from the main portion 26 of the sheet. The relative movement of the platens is controlled so that the tip ends of the lead portions move downwardly through a controlled, predetermined distance relative to the main portion 26 of sheet 10. At this stage of the process, the adhesive bond between the lead portions 24 of the sheet and the reinforcing element desirably is less than the strength of the bonds between the tips of the lead portions and the contacts of microelectronic element 40.

Lower platen 52 and microelectronic element 40 are also displaced in a horizontal direction H relative to the upper platen and sheet with portion 26 during the vertical movement. The direction of horizontal movement H is the horizontal direction from the tip ends of the leads toward the terminals 34 and fixed ends 30 of the leads. Thus, each lead tip end 28 moves horizontally towards its fixed end and to the associated terminal 34 while the lead tip end is moving vertically. This action compensates for the vertical movement of the lead tip ends away from the main region 26, so that the lead region s 24 are not pulled taut. The horizontal motion also deforms each lead region into generally S-shaped, curved configuration as depicted in FIG. 5. The motions of fixtures 50 and 52 may be controlled by any suitable movement device such as a suitable electromechanical, pneumatic, hydraulic device. A flowable liquid dielectric-forming material 54, such as an uncured gel or elastomer composition is injected under pressure between the front surface of the microelectronic element and the bottom surface 12 of sheet 10, while the fixtures 50 and 52 are moved vertically away from one another. Typically, the flowable composition 54 is injected under pressure so that the pressure of the composition forces the main region 26 of the sheet and upper fixtures 50 away from microelectronic element 40. An appropriate seal (not shown) may be provided around the periphery of the reinforcing element 16 and sheet 10. Also, the rear surface of the microelectronic element (the surface facing to the bottom in FIGS. 4 and 5)

may be sealingly secured to the lower fixture of 52 to prevent flow of the composition onto the rear surface of the microelectronic element. The flowable composition 54 flows into the space between the front surface 42 of the dielectric element and the bottom surface 12 of the sheet and main region, flows around the lead regions 24 and encapsulates these lead regions.

As the lead portions 24 are bent downwardly, they leave behind openings 56 (FIG. 5) in the main portion of the sheet. The reinforcing element 16 blocks passage of the flowable composition 54 through openings 56 and hence prevents the composition from spreading onto the top surface of 14 of the sheet main portion 26. This, in turn, prevents the composition from covering the exposed, upwardly facing surfaces of the terminal 34. The flowable composition is cured to form a compliant dielectric layer such as a gel or an elastomer. The reinforcing layer 16 is then peeled away from the top surface of the dielectric sheet main portion 26, thereby removing adhesive layer 18 and leaving terminals 34 exposed at top surface 14. Either before or after removal of the reinforcing element, the assembly is severed to form individual units (FIG. 6), each including one of the chips 40' originally incorporated within wafer 40 and the associated leads and terminals. Such severing may be performed, for example, by cutting the assembly using a standard wafer saw. Prior to peeling, the adhesive in layer 18 may be further degraded, as by heating the assembly or by exposing the assembly to chemicals which attack the adhesive but which do not attack the other components of the assembly. Alternatively, the adhesive bond can be released by heating the assembly to a temperature higher than that used in the bonding operation. In a further alternative, the reinforcing layer may be removed by dissolving it, by chemical or electrochemical etching of the reinforcing layer, desirably using an etchant which does not attack the other components in the assembly.

The resulting individual microelectronic assembly (FIG. 6) incorporates a dielectric sheet like element 26' cut from the main portion 26 of the dielectric layer 10, a chip 40' cut from the wafer end, a compliant layer 54' disposed between the dielectric element and the chip. The assembly also includes flexible leads 24' formed from the lead portions 24 of the sheet. Each such lead portion includes a polymeric layer integral with the polymeric layer in dielectric element 26'. Leads 24' project downwardly from the flexible -sheet like element 26' at openings 56 in the sheetlike element. The compliant layer 54 fills these openings and encapsulates the leads, but does not extend onto the top surface of the dielectric element. The assembly also includes terminals 34 carried on the sheetlike element 26', the terminals being connected to contacts 44 on chip 40 by conductors 32' of leads 24'. Terminals 34 are exposed to the top surface 14' of element 26'. Masses of electrically conductive bonding material 60 such as a solder or a filled polymer may be deposited on these terminals. Such masses may be used to bond the unit assembly onto a circuit panel such as a conventional circuit board. The compliant layer mechanically decouples sheetlike element 26' from chip 40' so that terminals 34 are free to move relative to the chip. The flexibility of leads 24' also contributes to mechanical decoupling of the terminals from the chip. Accordingly, expansion and contraction of chip 40 during service will not result in substantial fatigue stress on the bonding material masses 60.

The microelectronic element associated with the sheet need not include a unitary wafer. For example, as discussed in greater detail in commonly assigned U.S. Pat. No. 5,798,286, the disclosure of which is hereby incorporated by reference herein, a plurality of separate semiconductor chips or microelectronic elements may be attached to a connection component of the type disclosed in the aforementioned '964 patent. The separate elements may be moved away from the connection component in unison. The same approach may be employed in the present invention. Thus, a plurality of individual chips of microelectronic elements may be juxtaposed with sheet 10, so that the contacts on each such element are aligned with some of the leads. The contacts on each such chip may be bonded to the tip ends of the leads in the same manner as discussed above, in one operation or in separate operations. After the contacts of all of the chips are bonded to the tip ends of the leads, all of the chips may be moved simultaneously away from the main portion of the sheet, thereby bending the lead regions of the sheet associated with such contacts so as to form the vertically extensive leads in the same manner as discussed above. As also discussed in the aforementioned U.S. Pat. No. 5,798,286, the microelectronic elements and lead-bearing element can be handled and processed through a succession of stations using cartridges. The fixture elements 50 and 52 may be elements of such a cartridge. A succession of such cartridges can be advanced through a movement station which moves the fixture elements away from one another and injects the flowable composition. Each cartridge is removed from the movement station and the advanced into a curing oven. These fixture elements used in movement and curing stages may be different from the platens 46 and 48 (FIG. 3) used during the bonding operation, or may be the same components.

A component in accordance with a further embodiment of the invention (FIG. 7) includes a sheet incorporating polymeric layer 110. The bottom surface of polymeric layer 110 has metallic strips 132 thereon. Metallic strips 132 extend to metallic terminals 134. Strips 132 have a width corresponding to the desired width of the lead regions to be formed in the sheet. The bottom surface of the sheet is also provided with a potential plane 135 formed from the same metallic layer as strips 132 and terminals 134. Potential plane 135 is separated from each strip 132 and the associated terminal 134 by a gap 137 extending around the each strip and a further gap 133 bordering the terminal. A few of the terminals may be connected to the main region by one or more bridge elements 139, thereby connecting the associated leads 132 to the potential plane 135. Strips 133 have masses of electrically conductive bonding materials 136 such as those discussed above on tip ends of the strips, remote from terminals 134.

As in the embodiment discussed above with reference to FIGS. 1–6, the terminals 134 associated with strips 132 are aligned with vias 138 extending through polymeric layer 110. These vias are provided with conductive metallic via liners 141 extending through the polymeric layer and terminating at annular metallic rings 143 on the top surface of layer 110. The top surface of layer 110 is covered by a second metallic layer 101 defining an electrically conductive potential plane. The potential plane includes metallic strips 103 aligned with the strips 132 of the lower surface metallic layer. The strips 103 are physically separated from the remainder of the metallic layer 101 by gaps 105 in the metallic layer which partially surround each such strip. However, strips 103 are electrically connected to potential plane 101. Gaps 105 are aligned with the corresponding gaps 137 in the metallic layer on the lower surface. However, gaps 105 may have a width slightly larger than the width of gaps 137 on the lower surface metallic layer so that the gaps in the metallic layers will be still aligned with one another even if the metallic layers are slightly misregistered with one another. Upper surface metallic layer 101 includes holes 107 surrounding annular terminals 143 so that potential plane 101 remains electrically isolated from the terminals and from the metallic strips on the lower surface. A few of the annular terminals 143 may be electrically connected with the potential plane 101, so that the annular terminals and the associated metallic strips 132 can serve as connections to potential plane 101 as, for example, ground or power connections.

Figure 7:
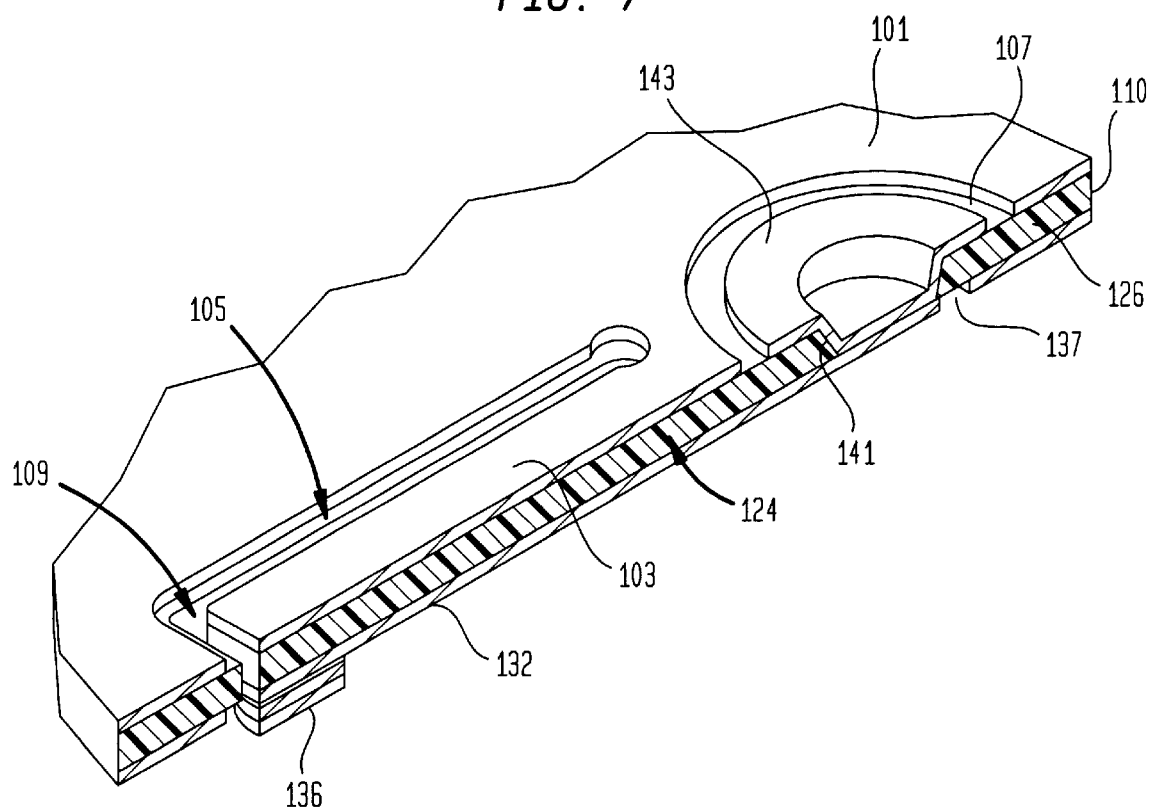
FIG. 7 is a fragmentary, partially sectional prospective view depicting a component in accordance of another embodiment of the invention.
Figure 8:
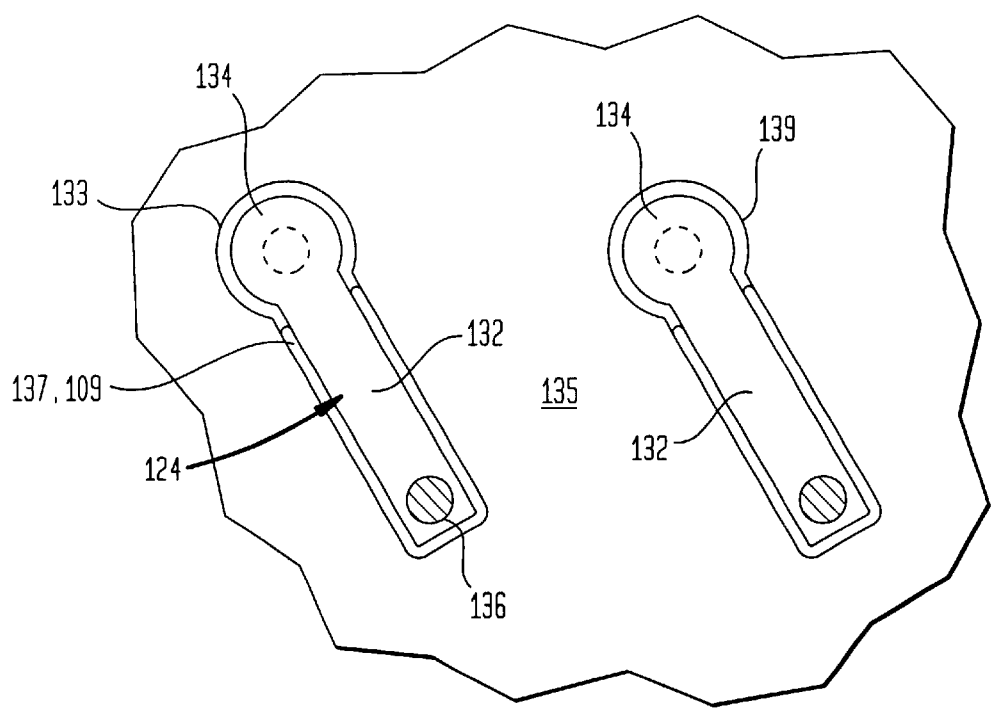
FIG. 8 is a fragmentary bottom plan view depicting the component of FIG. 7.
Figure 9:
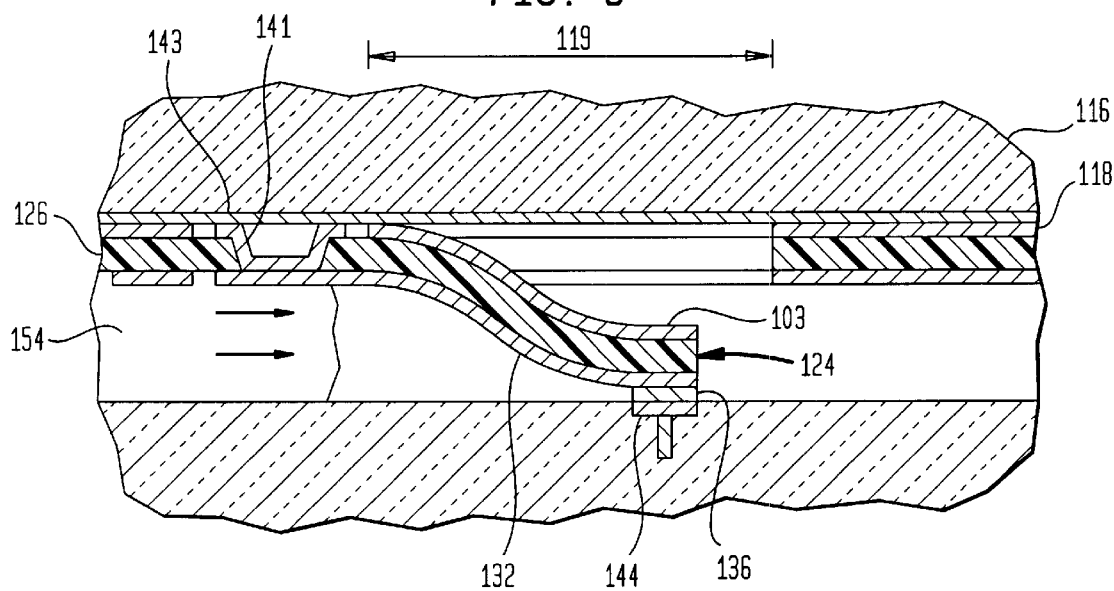
FIG. 9 is a view similar to FIG. 5 but depicting the components of FIGS. 7 and 8 in conjunction with other components, during a stage of processing.

The features discussed above may be formed by conventional processes such as additive or subtractive plating processes. The sheet also has gaps 109 extending through polymeric layer 110 in alignment with gaps 137 in bottom surface metallic layer and in alignment with gaps 105 in the top surface metallic layer. Gaps 109 are formed in the sheet after the surface of the sheet has been bonded to reinforcing element 116 (FIG. 8) by an adhesive layer 118. While the sheet is in place on the reinforcing element, an intense beam of radiant energy is directed onto the lower surface of the sheet in alignment with gaps 137. The beam may be somewhat larger than the width of gaps 137, so that the beam will cover each gap 137 even if the beam is slightly misregistered with the gap. The beam passes into gap 137 and ablates the polymeric material of layer 110, thereby forming gaps 109 in the polymeric layer. The bottom surface metallic layer including strips 132 and potential plane 135 act as mask during this procedure, and protect the other regions of the polymeric layer from ablating. The beam does not sweep across terminals 134 and the surrounding gaps 133 and, does not ablate the polymeric material around terminals 134. Here again, the gaps in the polymeric layer and in the metallic layers sub-divide the sheet into a main region 126 carrying the metallic potential plane 101 on the top surface and potential plane 135 on the bottom surface, and individual lead regions 124. Each lead region carries a metal strip 132 on its bottom surface and a further strip 103 continuous with potential plane 101 on its top surface. In the embodiment of FIGS. 7–9, the reinforcing element is formed from a non-metallic material, such as glass or quartz, that is transparent to radiation in a preselected band of wavelengths effective to degrade the adhesive bond 118. After the tip ends of the leads are bonded to the contacts 144 of the microelectronic element, radiation in this band of wavelengths may be applied through selected areas of reinforcing element 116 so that the radiation impinges on areas 119 of the adhesive bond aligned with lead regions 124, but does not impinge on other areas of the adhesive bond aligned with the main region of the sheet. Thus, the adhesive bond is degraded selectively in areas 119, so as to release the lead regions from the reinforcing element. Perfect selectivity is not required; the radiation may also release some minor part of the main region from the reinforcing element, provided that some parts of the main region remain bonded to the reinforcing element. Following such release, the reinforcing element and the main region of sheet 110 are moved away from the microelectronic element in the manner discussed above and the flowable composition is injected and cured. After curing, light is applied through the reinforcing element until the remaining portions of the adhesive bond degrade, so as to,free the main region of the sheet 110 from the reinforcing element. This radiation exposing step can be conducted non-selectively, by directing the radiation through all portions of the reinforcing element.

Figure 10:
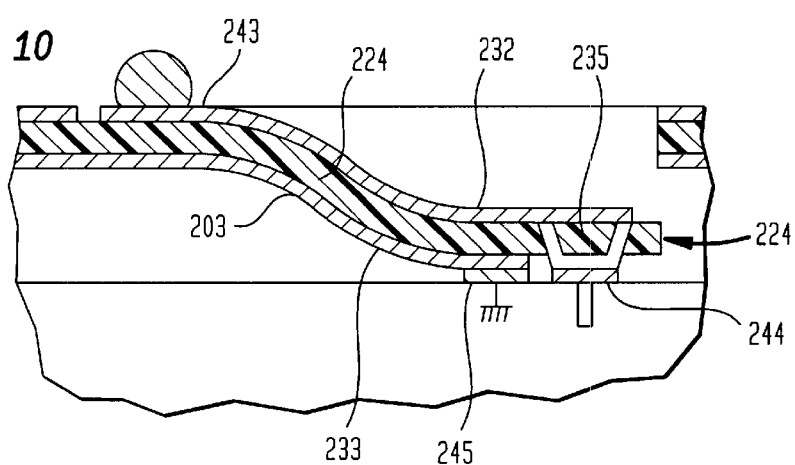
FIG. 10 is a fragmentary sectional view depicting an assembly in accordance with a further embodiment of the invention.

The sheet and microelectronic element are then subdivided in the manner discussed above, leaving individual unit assemblies or multichip modules. In use, these unit assemblies are connected to circuit board or circuit panel by applying electrically conductive bonding material onto the annular terminals 143 and via liners 141 and bonding the terminals to the circuit panel. This connects conductive strips 132 and the contacts 144 of the microelectronic element to the circuit panel. As mentioned above some of the annual terminals 143 are electrically connected to the top and bottom potential plane layers. A constant potential may be maintained on the top potential plane layer 101 (FIG. 7) and on strips 103 continuous therewith. This serves to provide a ground or power reference extending along each lead region 124. Each lead region thus provides a strip line, i.e., a signal path overlying a potential plane layer extending co-directionally with the signal path, and hence provides a controlled impedance along the lead itself. As shown in FIG. 10, the arrangement of signal and reference conductors may be reversed. Thus, the potential plane or reference conductor 233 may be disposed on the bottom surface of the sheet in the lead regions 224, and the signal conductor 232 may be disposed on the top surface. A conductive element 235 such as a metal via liner extends through the polymeric layer at the tip end of the lead region 224. In the assembly process, the conductive via liner 235 is bonded to the signal contact 244 the microelectronic element. Reference conductor 203 may be bonded to a reference contact 245 such as ground contact of a chip. In this arrangement the terminals 243 associated with the signal conductors may be disposed on the top surface of the sheet.

Figure 11:
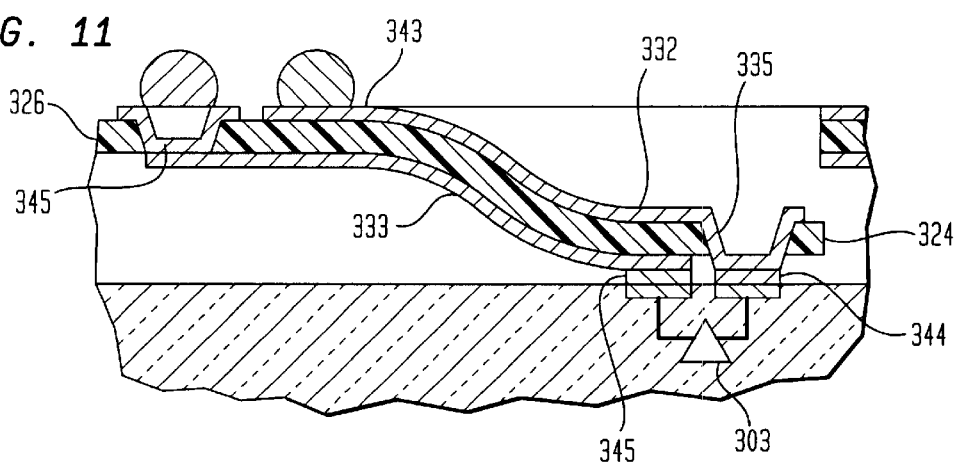
FIGS. 11, 12, and 13 are views similar to FIG. 10 but depicting assemblies in accordance with other embodiments of the invention.

As seen in FIG. 11, some or all of the lead regions may include two signal conductors 332 and 333 extending along the top and bottom surfaces of the sheet in lead regions 324. Here again, the top surface signal conductor 332 is provided with a conductive element such as a via liner 335 extending through the polymer layer of the lead region at the tip end of the lead. Conductors 332 and 333 may be connected to terminals 343 and 345 on the main portion 326 of the sheet. These terminals may be disposed in pairs adjacent to one another and adjacent to the associated lead portion 324. These signal conductors provide a set of paired conductors extending along the lead which can provide a controlled impedance signal path. The use of leads incorporating multiple conductors is described in greater detail in co-pending, commonly assigned U.S. patent application Ser. No. 08/715,571, filed Sep. 19, 1996 and Ser. No. 09/020,754 filed Feb. 9, 1998, the disclosures of which are hereby incorporated by reference herein. As shown in certain embodiments disclosed in those applications, a circuit within a microelectronic element could be arranged to transmit signals as oppositely-directed pulses on two contacts. For example, circuit 303 is arranged to transmit signals as oppositely directed voltage pulses on contacts 344 and 345. These oppositely directed pulses will be conveyed through leads 332 and 333. As described in greater detail in the co-pending applications, the use of multiple conductors on a single lead can provide a balanced transmission line extending all the way from the contacts of the chip itself to the external circuit and minimizes a problem such as cross talk and interference. As for the described in the co-pending applications, arrangements including more than two conductors on a lead may be employed as, for example, in a lead with incorporates 3 conductors such as a reference conductor and two opposite signal conductors conveying oppositely directed voltage pulses. As also described in the copending applications, multiple-conductor signal paths and striplines may extend along the dielectric layer. For example, the main region of the dielectric layer may be provided with one or more layers of signal conductors, which may interconnect the signal conductors of the leads with one another. These interconnections can provide signal paths between multiple components attached to the dielectric element. As discussed in co-pending, commonly assigned U.S. patent application Ser. No. 09/053,816 filed Apr. 2, 1998, the disclosure of which is hereby incorporated by reference herein, such interconnections may be used to provide signal paths within a single semiconductor chip. All of these arrangements may be implemented within the present invention.

Figure 12:
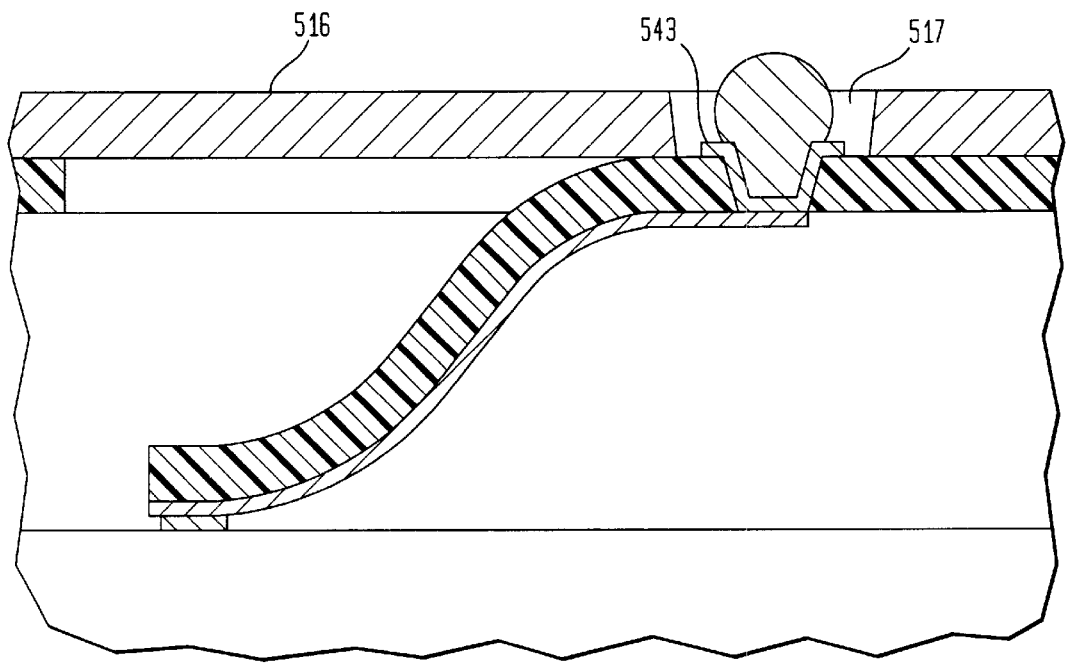
Figure 13:
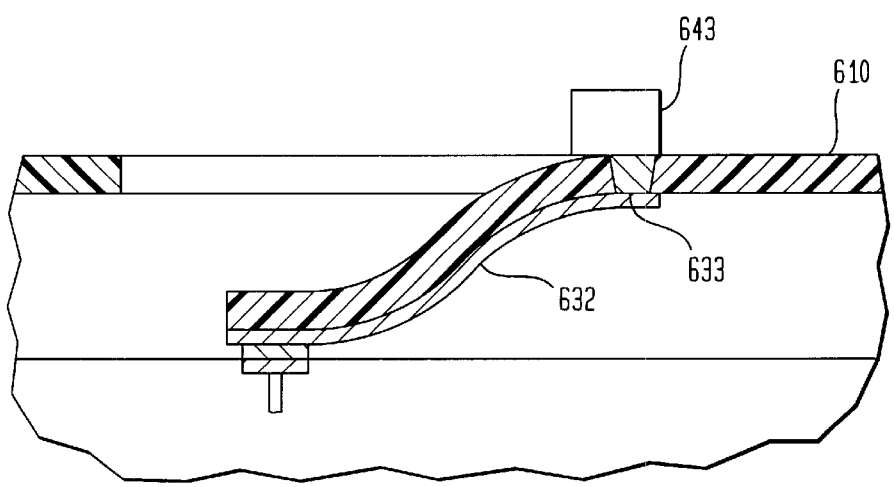

As shown in FIG. 12, the reinforcing element 516 may remain in place on the polymeric layer at the end of the assembly process provided that the reinforcing element has apertures, such as apertures 517 aligned with the terminals 543. In other respects, the process may be the same as that described above. Where reinforcing element 516 is formed from a conductive material such as a metal, the reinforcing element may be connected to a few of the terminals so as to provide ground or power connections. In this case, the reinforcing elements serve as a potential reference plane. As seen in FIG. 13, the step of removing the reinforcing element may be performed by a process such as a selective etching process which leaves portions of the reinforcing element as terminals 643 connected to some or all of the conductive elements 632 of the lead portions as, for example, by via liner 633 extending through the main portion of polymeric layer 610. In other respects, the process is the same as that discussed above. Formation of terminals from a reinforcing element is described in commonly assigned U.S. Pat. No. 5,989,936, the disclosure of which is also incorporated by reference herein.

Figure 14:
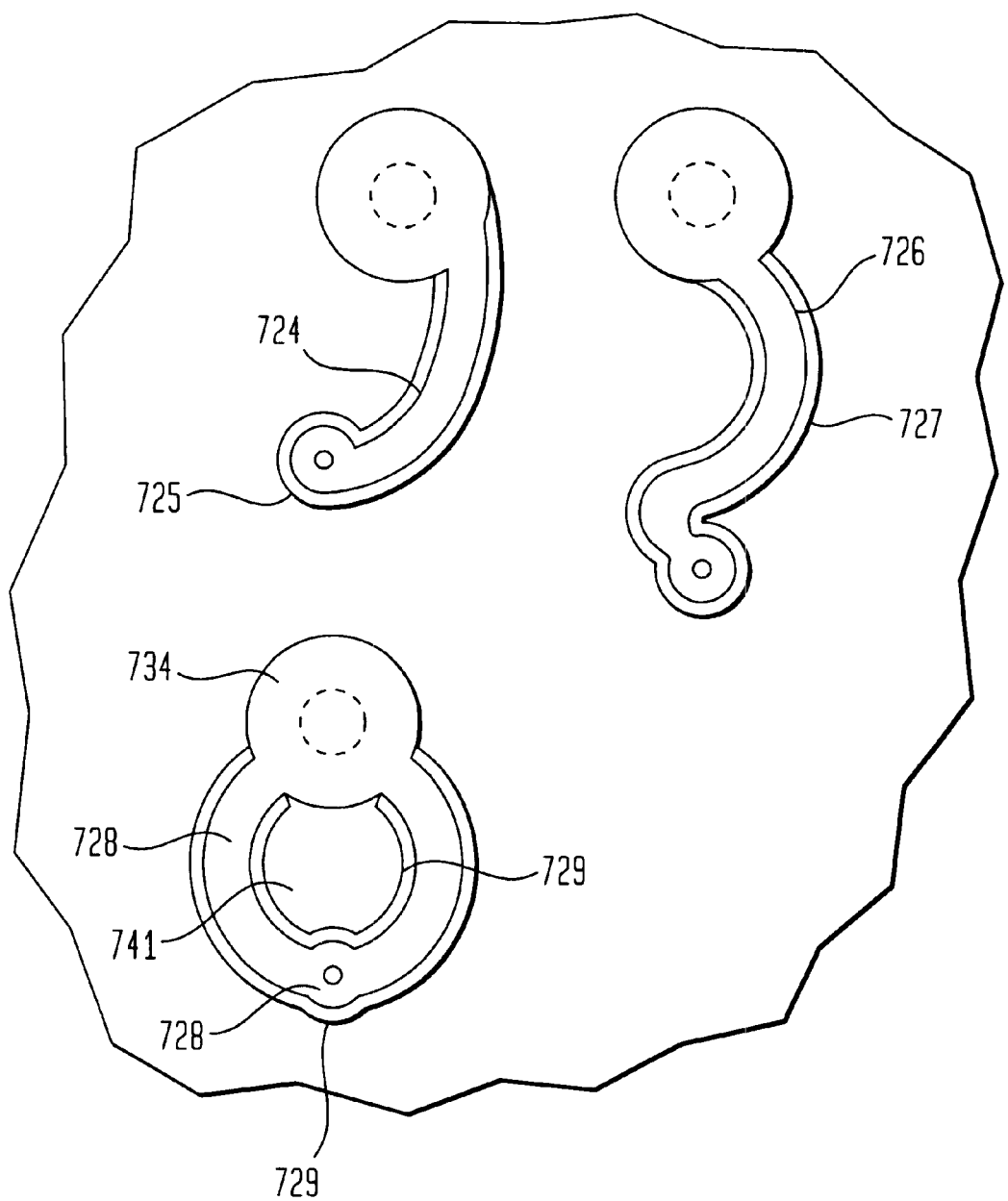
FIG. 14 is a fragmentary diagrammatic plan view of a component according to a further embodiment of the invention.

As shown in FIG. 14, the lead regions 724, 726, 728 may have various configurations. The gaps 725, 727 and 729 surrounding these lead regions may have correspondingly varied shapes. In each case, the gaps extend alongside the lead regions. Where the lead regions are curved in a horizontal direction along the sheet, the movement step need not include a horizontal displacement of the microelectronic element relative to the main portion of the sheet. Thus, the vertical movement will serve to partially straighten the initially curved lead regions. Lead region 728 is in the form of a closed loop connecting the terminal 734 with the tip and 728 of the lead region. The lead region thus encircles a portion 741 of the main region of the sheet. However, this portion will remain in a position when the lead region is deformed downwardly, (out of the plane of the drawing as seen in FIG. 14), because the isolated regions 741 will be supported by the reinforcing element adhering to the top surface of the sheet. The lead shapes taught in the aforementioned commonly assigned U.S. Pat. Nos. 5,859,472 and 6,191,368 may be utilized.

Figure 15:
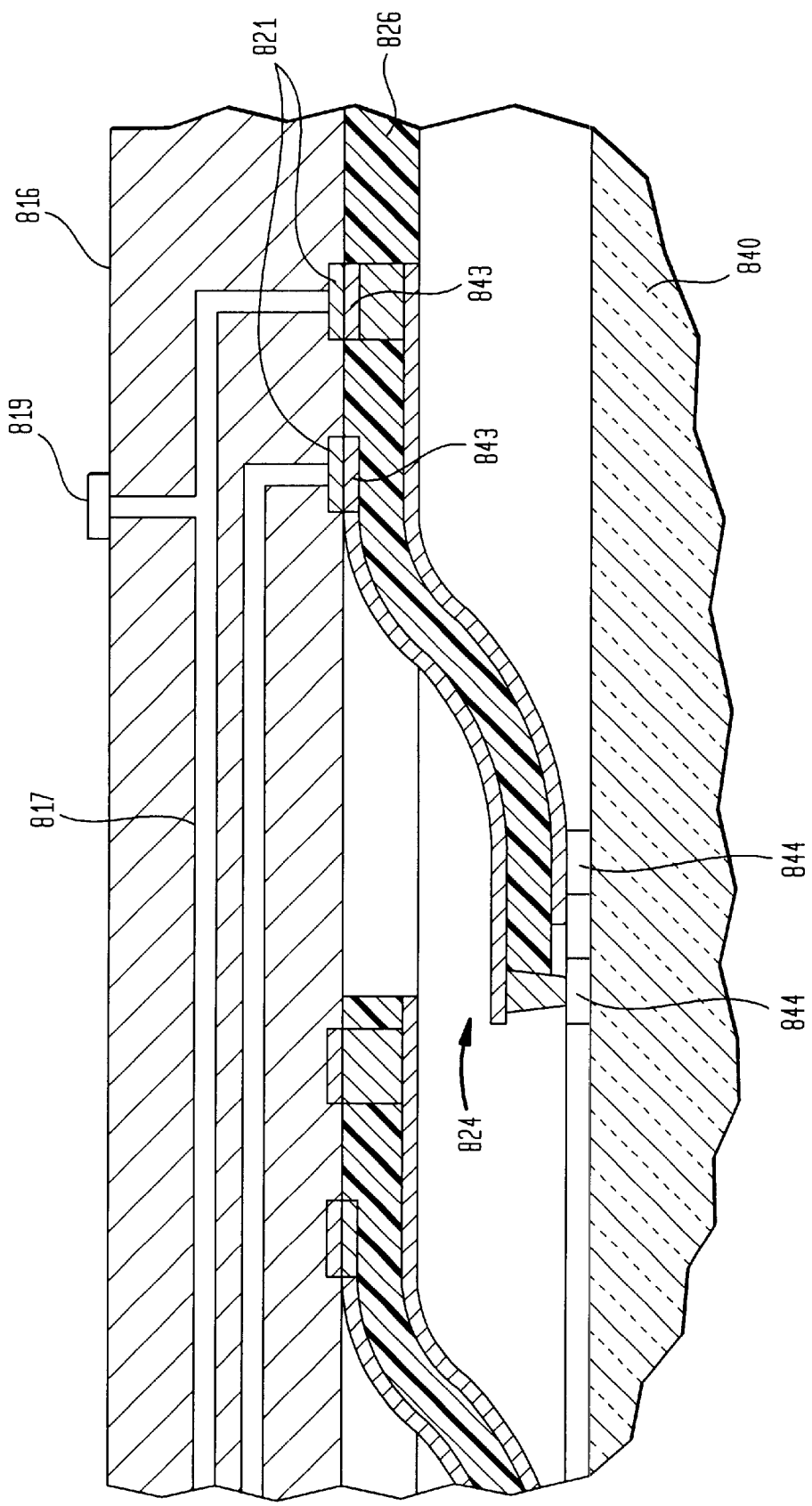
FIG. 15 is a fragmentary sectional view depicting an assembly in accordance with a yet another embodiment of the invention.

The assembly of FIG. 15 incorporates a sheet having a main portion 826 and lead portions 824 as discussed above, together with a reinforcing element 816 which includes electrically conductive elements such as conductors 817 and terminals 819. For example, the reinforcing element may be a relatively rigid circuit panel such as a ceramic panel having metallic conductors thereon; a rigid polymeric circuit panel such as a fiber-reinforced epoxy panel with metallic conductors; or a metal-reinforced circuit panel having a metallic core and a dielectric coating with conductors on the dielectric coating. The reinforcing element may include one or more layers of conductors, and may include conductors extending in plural directions. In the assembly process, the sheet is provided in place on the reinforcing element. The conductors of the lead regions are electrically connected to the conductive elements of the reinforcing element. For example, the sheet may be fabricated separately from the reinforcing element and the terminals 843 of the sheet may be bonded to contacts 821 on the reinforcing element by any conventional bonding material and process. At this stage, the lead regions of the sheet extend along the lower surface of the reinforcing element. The tip ends of the lead regions are then bonded to the contacts 844 of the microelectronic element 840 in the manner discussed above, and the microelectronic element may be moved downwardly to bend the lead regions as described above. The reinforcing element remains as part of the finished assembly. In yet another variant, the reinforcing element may include layers having conductive elements such as conductors and/or terminals, and additional layers which serve only as structural reinforcement during the assembly process. These additional layers can be removed after the assembly process. For example, the reinforcing element may include a metallic layer and a rigid or flexible polymer-and-metal composite structure including the conductors. The metal layer is removed after the assembly process.

In embodiments discussed above, the electronically conductive bonding material is carried on the tip ends of the leads. However, this is not essential; a bonding material may be carried on the contacts of the microelectronic element. Alternatively, the conductors of the leads may be bonded to the contacts of the microelectronic element by a process such of thermocompression bonding or other bonding methods with do not require a separate bonding material.

As these and other variations and combinations of the features discussed above, can be utilized without departing from the present invention as defined by the claims, the foregoing description of the preferred embodiments should be taken by way of illustration rather than by limitation of the invention as defined by the claims.

What is claimed is:

1. A component for forming a microelectronic assembly comprising a sheet including a main region and a plurality of gaps partially surrounding and defining a set of flexible elongated lead regions of said sheet, each such lead region having a fixed end connected to said main region and a tip end remote from said fixed end, said sheet including a continuous layer of a polymeric material having oppositely-facing top and bottom surfaces extending within said main region and said lead regions, said lead regions of said sheet including metallic conductors extending on said polymeric layer between said tip ends and said fixed ends of said lead regions, at least some of said conductors being electrically isolated from the remaining said conductors and the component further including terminals disposed on said main region and electrically connected to at least some of said metallic conductors.

2. A component as claimed in claim 1 further comprising a metallic potential plane overlying a surface of said sheet in said main region, at least some of said metal conductors being electrically isolated from said potential plane.

3. A component as claimed in claim 2 wherein said metallic conductors are provided on only one surface of said sheet and said potential plane is provided on the same surface of said sheet as said metallic conductors.

4. A component as claimed in claim 3 wherein said potential plane and said metallic conductors are provided on the bottom surface of said sheet.

5. A component as claimed in claim 1 wherein, in at least some of said lead regions, said metallic conductors are provided on both said top and bottom surfaces.

6. A component as claimed in claim 5 further comprising a metallic potential plane overlying a first surface of said polymeric layer in said main region, the metallic conductors on said first surface in at least some of said lead portions being connected to said potential plane, at least some of the metallic conductors on a second surface of said polymeric layer being electrically isolated from said potential plane and connected to said terminals.

7. A component as claimed in claim 5 wherein some of said terminals are electrically connected to said conductors on a top surface of said polymeric layer, others of said terminals being electrically connected to said conductors on said bottom surface of said polymeric layer.

8. A component as claimed in claim 7 wherein said terminals include pairs of adjacent terminals, the terminals of each said pair being connected to conductors on the top and bottom surfaces of a single lead region.

9. A component as claimed in claim 5 wherein said polymeric layer is between about 25 µm and about 75 µm thick.

10. A component as claimed in claim 9 wherein said metallic conductors are between about 5 µm and about 15 µm thick.

11. A component as claimed in claim 5 wherein said polymeric layer is formed from polyimide.

12. A component as claimed in claim 1 wherein at least some of said metallic conductors are provided on said bottom surface of said polymeric layer, said terminals being exposed to said top surface of said sheet, said terminals being electrically connected to said conductors on said bottom surface of said polymeric layer.

13. A component as claimed in claim 12 wherein at least some of said terminals are disposed on said bottom surface of said polymeric layer in said main region, said polymeric layer having vias extending through said polymeric layer in alignment with said terminals on said bottom surface.

14. A component as claimed in claim 13 further comprising annular metallic elements surrounding said vias on said top surface of said polymeric layer.

15. A component as claimed in claim 14 further comprising electrically-conductive via liners extending through said polymeric layer, said via liners electrically connecting said annular metallic elements to said terminals on said bottom layer.

16. A component as claimed in claim 1 wherein said gaps are generally U-shaped, each said U-shaped gap having two legs and a base between said legs, whereby each said lead region has a tip adjacent the base of one such U-shaped gap.

17. A component as claimed in claim 16 further comprising holes extending through said sheet, each said hole being positioned at the end of one said leg of one said U-shaped gap, said end being remote from said base of said one said U-shaped gap, said each said hole having a diameter greater than the width of that one said leg.

18. A component as claimed in claim 1 further comprising a reinforcing element overlying the top surface of the sheet, said lead portions being releasably attached to said reinforcing element.

19. A microelectronic assembly comprising:

(a) a microelectronic element having contacts thereon;

(b) a sheetlike element including a polymeric dielectric layer, said sheetlike element overlying a surface of said microelectronic element, said sheetlike element having terminals thereon and having a plurality of openings extending therethrough, said sheetlike element having a top surface facing away from said microelectronic element and a bottom surface facing toward said microelectronic element;

(c) a plurality of flexible leads projecting downwardly from said sheetlike element at said openings, each said flexible lead including a polymeric layer integral with said sheetlike element and at least one metallic conductor, at least some of said conductors being connected to said terminals and to said contacts; and (d) a compliant layer disposed between said microelectronic element and said sheetlike element, said compliant layer encapsulating said flexible leads and extending through said opening but not extending onto said top surface of said microelectronic element.

20. An assembly as claimed in claim 19 further comprising an electrically conductive reinforcing element overlying said top surface of said sheetlike element and occluding said openings, said reinforcing element having holes aligned with said terminals.

21. An assembly as claimed in claim 19 wherein said metallic conductors are disposed on bottom surfaces of said polymeric layers of said leads and said terminals are disposed on the bottom surface of said sheetlike element and formed integrally with said conductors.

* * * * *